US007872600B2

United States Patent
Liao et al.

(10) Patent No.: US 7,872,600 B2
(45) Date of Patent: Jan. 18, 2011

(54) LOW COST ANALOG TO DIGITAL CONVERTER AND A METHOD FOR CONVERTING AN ANALOG SIGNAL TO A DIGITAL SIGNAL

(75) Inventors: Tung-Tsai Liao, Hsin Chu (TW); Li Sheng Lo, Hsin Chu County (TW)

(73) Assignee: Generalplus Technology, Inc., Hsinchu (TW)

( * ) Notice: Subject to any disclaimer, the term of this patent is extended or adjusted under 35 U.S.C. 154(b) by 18 days.

(21) Appl. No.: 12/349,841

(22) Filed: Jan. 7, 2009

(65) Prior Publication Data

US 2010/0033360 A1 Feb. 11, 2010

(30) Foreign Application Priority Data

Aug. 7, 2008 (TW) .............................. 97129992 A

(51) Int. Cl.
*H03M 1/12* (2006.01)
(52) U.S. Cl. ...................... 341/155; 341/166
(58) Field of Classification Search ................ 341/115, 341/143, 166, 157, 144; 375/238
See application file for complete search history.

(56) References Cited

U.S. PATENT DOCUMENTS

| 5,337,338 | A * | 8/1994 | Sutton et al. | 377/33 |
| 7,242,330 | B2 * | 7/2007 | Alter | 341/118 |
| 7,292,081 | B2 * | 11/2007 | Takegami | 327/172 |
| 2002/0149505 | A1 * | 10/2002 | Kanno | 341/152 |

* cited by examiner

*Primary Examiner*—Peguy JeanPierre
(74) *Attorney, Agent, or Firm*—Muncy, Geissler, Olds & Lowe, PLLC

(57) ABSTRACT

The present invention relates to a low cost analog to digital converter (ADC) and a method for converting an analog signal to a digital signal. The method includes the steps of: outputting a pulse modulation signal according to a digital value; performing a low-pass filtering to the pulse modulation signal to obtain a pulse averaged voltage; mixing a first proportion of the pulse averaged voltage and a second proportion of a voltage under test to obtain a composite voltage; comparing the composite voltage with a threshold voltage and adjusting the first digital value such that the composite voltage approaches the threshold voltage; and performing a complement operation to the digital value to obtain an analog to digital value corresponding to the voltage under test.

18 Claims, 5 Drawing Sheets

LOW COST ANALOG TO DIGITAL CONVERTER AND A METHOD FOR CONVERTING AN ANALOG SIGNAL TO A DIGITAL SIGNAL

This application claims priority of No. 097129992 filed in Taiwan R.O.C. on Aug. 7, 2008 under 35 USC 119, the entire content of which is hereby incorporated by reference.

BACKGROUND OF THE INVENTION

1. Field of Invention

The invention relates to the technology associated with an analog to digital conversion, and more particularly to a method for converting an analog signal to a digital signal and a low cost analog to digital converter using the same.

2. Related Art

With the progress of the technology, the electronic technology has been evolved from the earliest vacuum tube and transistor to the integrated circuit which has the quite wide applications. Thus, the electronic products have gradually become the indispensable essentials in the life of the modern human beings. Many products are redeveloped with electronic components such as the electric piano, the electric toothbrush, etc. The purpose of the embedded electronic functions is to let people use the products more conveniently. Hence, lots of novel control systems are developed. Moreover, the analog to digital converter is widely used in the control systems such as the processing of sound, the measurement of temperature, the processing of webcam image and so forth.

FIG. 1 is a circuit diagram showing an analog to digital converter according to the prior art. Referring to FIG. 1, the resolution of the conventional art is 3 bits. The analog to digital converter includes 8 comparators 101-108, 9 resistors R101-R109, a decoding circuit 109 and a voltage follower 110. The voltage follower 110 is used for impedance match and outputs an output voltage which is equal to input voltage VIN. The 9 resistors R101-R109 are connected in series and correspondingly coupled to the negative terminals of the comparators 101-108. The supply voltage VDD is divided into 8 voltage sources by the 9 resistors R101-109. As a result, the negative terminal of comparator 101 receives 1/9 VDD, the negative terminal of comparator 102 receives 2/9 VDD . . . , the negative terminal of comparator 108 receives 8/9 VDD.

For example, the output signals C01-C05 of comparators 101-105 are positive voltage rail when input voltage VIN is more than 5/9 VDD but the output signals C06-C08 of comparators 106-108 are negative voltage rail. Therefore, the digital output values of the decoding circuit 109 D01, D02, and D03 are 1,0, and 1.

From the example, to construct a 3-bits analog to digital converter needs at least 9 resistors R101-R109, 9 comparators 101-108, 110 and a decoding circuit 109. Therefore, to construct an 8-bits analog to digital converter needs at least 257 resistors, 256 comparators, and a 256 to 8 decoding circuit. However, it is not cost effective for the system design manufacturer or integrate circuit manufacturer.

SUMMARY OF THE INVENTION

An object of the invention is to provide an analog to digital converter which can be made up of cheaper electronic devices. Therefore, the invention can perform analog to digital conversion with lower cost.

Another object of the invention is to provide a method for converting an analog signal to a digital signal. The method needs fewer external devices to measure the slow changed analog signals and it can be applied in temperature measurement, sound wave envelope detector, and so forth.

To achieve the above-identified or other objects, the invention provides a low cost analog to digital converter comprising a microprocessor, a low-pass filter, and an analog adder. The microprocessor includes a first output terminal, a second output terminal and an input terminal, wherein the first output terminal thereof is used for providing a pulse modulation signal according to a first digital value, and the input terminal includes a logic threshold voltage. The low-pass filter is coupled to the first output terminal of the microprocessor for filtering the pulse modulation signal to output a pulse average voltage. The analog adder includes a first input terminal for receiving the pulse average voltage, a second input terminal for receiving a voltage under test, and an output terminal for providing a composite voltage, wherein the composite voltage includes the pulse average voltage with a first proportion and the voltage under test with a second proportion. The input terminal of the microprocessor receives the composite voltage, and adjusts the first digital value such that the composite voltage approaches the logic threshold voltage, and then an analog to digital conversion value corresponding to the voltage under test is obtained according to the first digital value.

The low cost analog to digital converter according to the preferred embodiment of the invention, the low-pass filter includes a first resistor and a first capacitor. The first resistor includes a first terminal and a second terminal, wherein the first terminal thereof is coupled to the first output terminal of the microprocessor. The first capacitor includes a first terminal coupled to the second terminal of the first resistance and a second terminal coupled to a common voltage. In addition, the analog adder includes a second resistor and a third resistor. The second resistor includes a first terminal coupled to the second terminal of the first resistor. The third resistor includes a first terminal coupled to the second terminal of the second resistor and a second terminal for receiving the voltage under test.

The low cost analog to digital converter according to the preferred embodiment of the invention, the analog adder includes a first resistor and a second resistor. The first resistor includes a first terminal coupled to the first output terminal of the microprocessor and a second terminal coupled to the input of the microprocessor. The second resistor includes a first terminal coupled to the second terminal of the first resistor and a second terminal for receiving the voltage under test. In addition, the low-pass filter includes a first capacitor. The first capacitor includes a first terminal coupled to the second terminal of the first resistor and a second terminal coupled to a common voltage. Moreover, the pulse modulation signal is a pulse width modulation signal or a pulse density modulation signal in the embodiments.

In addition, the invention provides a method for converting an analog signal to a digital signal, the method includes the steps of: outputting a pulse modulation signal according to a first digital value; performing a low-pass filtering to the pulse modulation signal to obtain a pulse average voltage; mixing the pulse average voltage with a first proportion and the voltage under test with a second proportion to obtain a composite voltage; comparing the composite voltage with a threshold voltage and adjusting the first digital value such that the composite voltage approaches the threshold voltage; and performing a complementary operation and a value stabilized operation to obtain an analog to digital value corresponding to the voltage under test.

The invention also provides another method for converting an analog signal to a digital signal, the method includes the steps of: performing a complementary operation to a first digital value to obtain a second digital value; outputting a pulse modulation signal according to a second digital value; mixing the pulse average voltage with a first proportion and the voltage under test with a second proportion to obtain a composite voltage; comparing the composite voltage with a threshold voltage and adjusting the first digital value such that the composite voltage approaches the threshold voltage; performing a value stabilized operation to the first digital value and the second digital value; and setting the second digital value to serve as an analog to digital value corresponding to the voltage under test.

The spirit of the invention is to modify the internal digital value in a microprocessor for changing the output pulse modulation signal, to convert a analog signal to the digital signal through using a low-pass filter, and to mix the analog signal corresponding to the digital signal and the analog voltage under test being converted to a digital signal by using an analog adder for obtaining a composite voltage, and then to adjust the internal digital value of the microprocessor based on the threshold voltage which is build in the input terminal of the microprocessor, such that the composite voltage approaches the threshold voltage. Since the internal digital value is related to the analog voltage under test, the digital value corresponding to the voltage under test can be consequently obtained by performing a complementary operation to the internal digital value.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
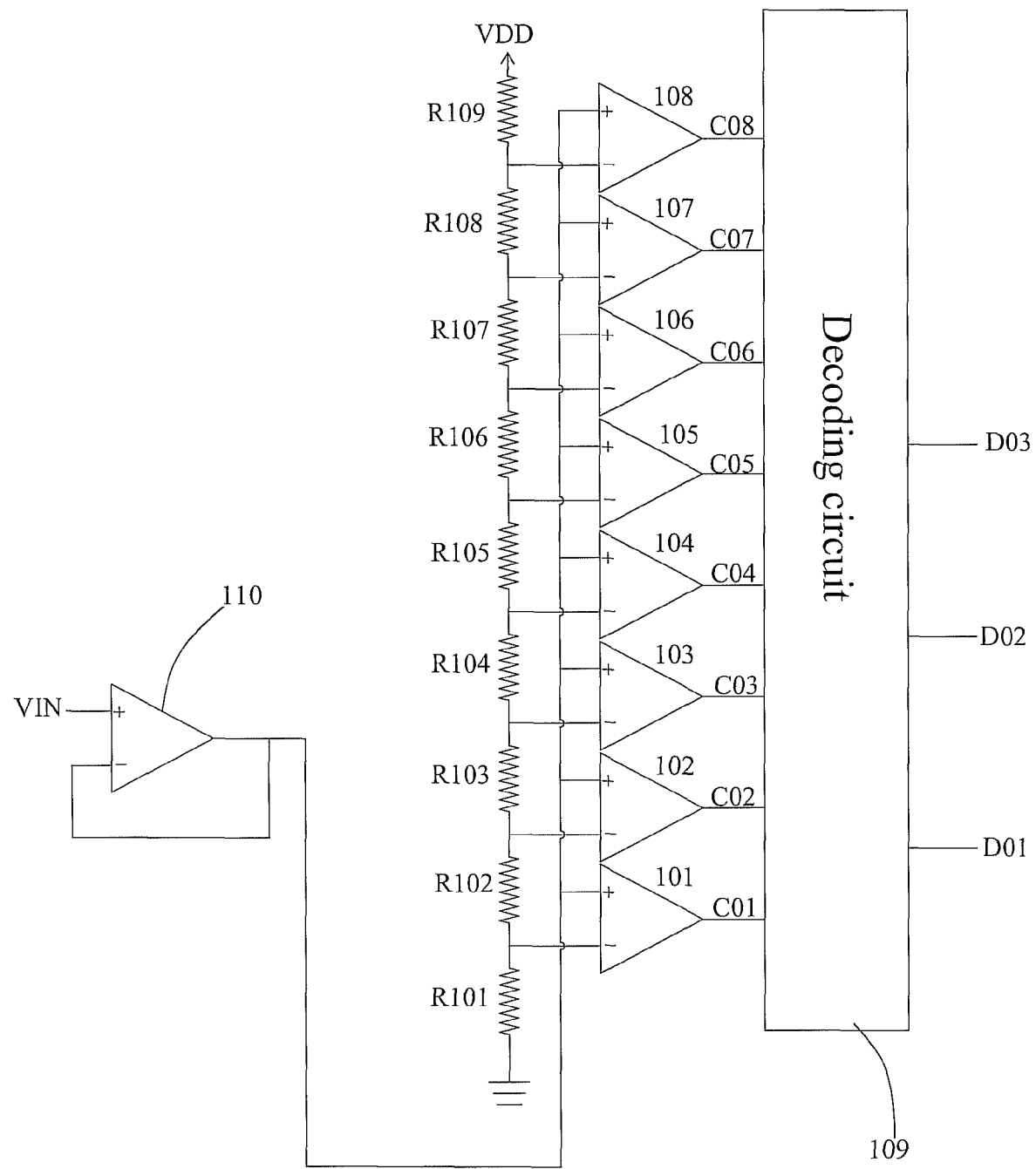
FIG. 1 is a schematic diagram of the prior art circuit including an analog to digital converter.
Figure 2:
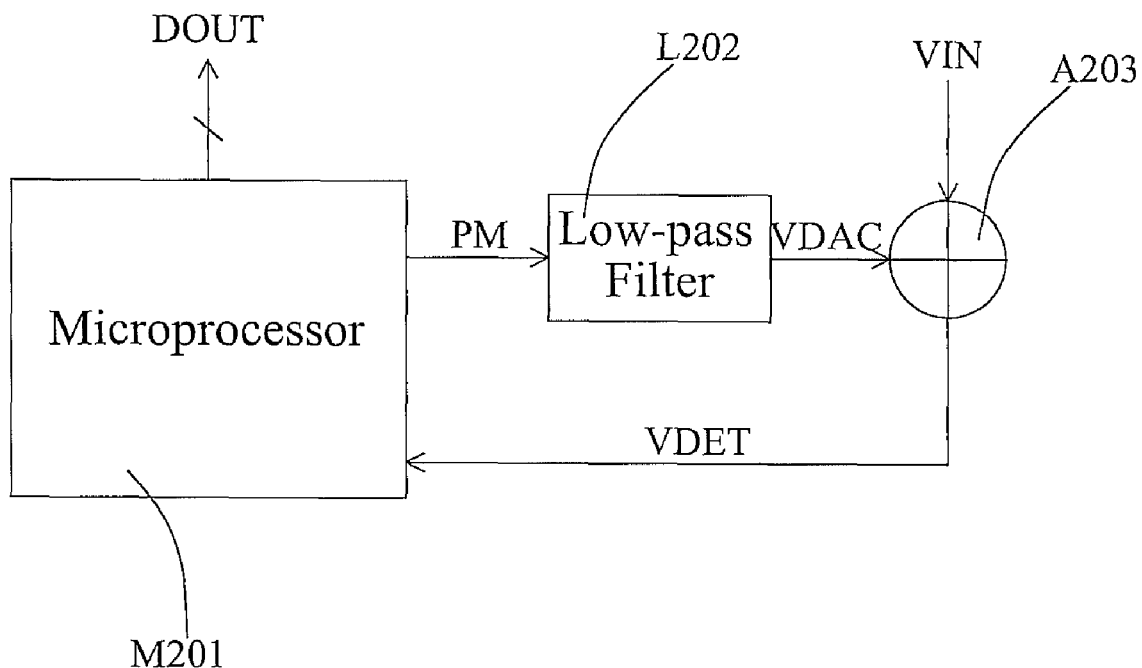
FIG. 2 is a system block diagram of a low cost analog to digital converter according to the embodiment of the invention.

FIG. 2 is a system block diagram of a low cost analog to digital converter according to the embodiment of the invention. In this embodiment of FIG. 2, the analog to digital converter includes a microprocessor M201, a low-pass filter L201 and an analog adder A201. The microprocessor M201 provides a pulse modulation signal PM. Then a low-pass filter is used for filtering the pulse modulation signal PM to output a pulse average voltage VDAC. An analog adder A201 receives the pulse average voltage VDAC and a voltage under test VIN to provide a composite voltage VDET which includes the pulse average voltage VDAC with a first proportion and the voltage under test VIN with a second proportion. Furthermore, the composite voltage VDET is feedback to the microprocessor M201. To express the spirit of the present invention more clearly, a detailed description of the preferred embodiment is shown to help a person having ordinary skill in the art to comprehend the present invention.

Figure 3:
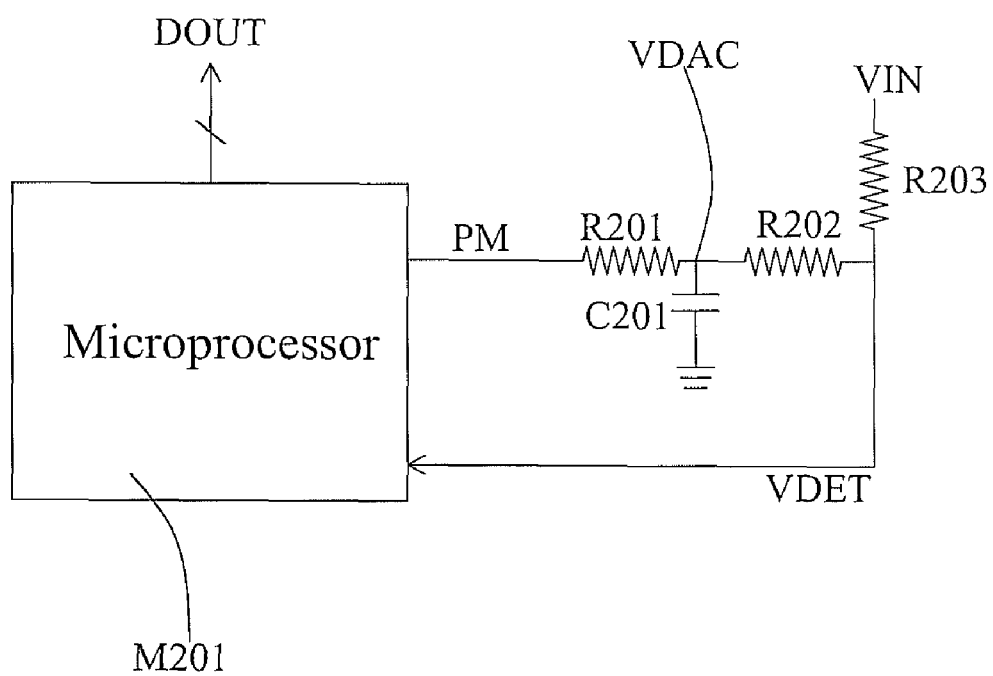
FIG. 3 is a detailed circuit diagram of a low cost analog to digital converter according to the embodiment of the invention shown in FIG. 2.

FIG. 3 is a detailed circuit of the low cost analog to digital converter according to the description of the preferred embodiment of FIG. 2. In the embodiment of FIG. 3, the low-pass filter L201 is implemented by a resistor R201 and a capacitor C201, the analog adder A201 is implemented by resistors R202 and R203. Afterward it is assumed that the pulse modulation signal PM is a pulse density modulation signal (hereinafter referred to as PDM). The feature of PDM is that the numbers of its output pulses within a time unit would be varied according to the digital value inside the microprocessor M201. In other words, the pulse density within a time unit is higher when the digital value is increased. Therefore, the digital value can be transferred to the analog voltage as well as pulse average voltage VDAC through performing the low-pass filtering to the pulse density modulation PDM by using the low-pass filter L201 which is implemented by a resistor R201 and a capacitor C201.

Figure 4:
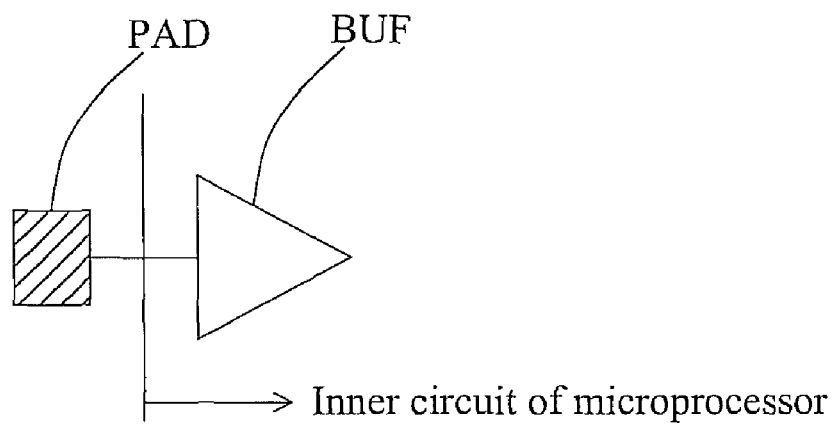
FIG. 4 is a detailed circuit diagram inside an input pin of a microprocessor according to the embodiment of the invention.

Moreover, the resistors R201 and R203 in the analog adder A201 is designed to be larger to avoid the low-pass filter L201 suffering the load effect. Therefore, the composite voltage VDET can be represented as:

$$VDET = \frac{VDAC \times R203 + VIN \times R202}{R202 + R203}, \qquad \text{EQ 1}$$

wherein the composite voltage VDET is feedback to a pin of the microprocessor M201. FIG. 4 is a detailed circuit inside the input pin of the microprocessor M201 according to the embodiment of the invention. The input pin circuit of the microprocessor M201 is shown in FIG. 4, which includes a pad PAD and an input buffer BUF. Furthermore, the input buffer BUF has a threshold voltage (hereinafter referred to as VTH) and the input voltage would be regarded as logic 1 when the input voltage is higher than VTH. Thus the microprocessor M201 would receive logic 1. And the microprocessor M201 would receive logic 0 when the input voltage is lower than VTH. When the composite voltage VDET closes to the threshold voltage (VTH), the input pin of the microprocessor M201 would receive either logic 1 or logic 0 alternatively. Therefore the EQ1 can be rewritten as:

$$VTH + VNOISE = \frac{VDAC \times R203 + VIN \times R202}{R202 + R203}, \qquad \text{EQ 2}$$

wherein VNOISE represents a slight noise voltage. Next, according to EQ2, the pulse average voltage VDAC could be represented as follows:

$$VDAC = \frac{(VTH + VNOISE) \times (R203 + R202) - R202 \times VIN}{R203}$$ EQ 3

$$= (VTH + VNOISE) \times \left(1 + \frac{R202}{R203}\right) - \left(\frac{R202}{R203}\right) \times VIN$$

$$= (VTHN) \times \left(1 + \frac{R202}{R203}\right) - \left(\frac{R202}{R203}\right) \times VIN,$$

wherein VTHN represents the sum of the threshold voltage (VTH) and the slight noise voltage (VNOISE).

If the slight noise voltage (VNOISE) could be ignored and it is assumed that the threshold voltage (VTH) is equal to a half of VDD, wherein the VDD means the supply voltage; and the resistor R202 is equal to resistor R203. The equation EQ3 can be represented as:

VDAC=VDD-VIN    EQ4.

From the equations above, a person having ordinary skill in the art can obtain that the supply voltage VDD is represented 255 with 8-bit digital resolution. If the corresponding digital value of the pulse average voltage VDAC is 80, the corresponding digital value DOUT of the voltage under test VIN is equal to 255−80=175 by EQ4. In other words, a person having the ordinary skill in the art can design the microprocessor M201 by using the relationship of complement to obtain the corresponding digital value DOUT of the voltage under test VIN according to the method given above.

However, the threshold voltage (VTH) is not a half of VDD in general; it might be 0.35 VDD. So the EQ4 would be rewrite to

VDAC=0.7×VDD-VIN    EQ5.

The difference between EQ4 and EQ5 is the scale of the supply voltage VDD, which means the different complement operation. For example, if the corresponding digital value of the pulse average voltage VDAC are both 80 in EQ4 and EQ5, the corresponding digital value DOUT of the voltage under test VIN are 175 in EQ4 and 0.7×255−80=98 in EQ5. It is only the difference of complement operation and does not influence the operation of the embodiment of the invention. Therefore, the invention should not be limited by the equations above.

In addition, the pulse density modulation signal (PDM) is illustrated in the above-mentioned embodiment of the invention. However, a person having ordinary skill in the art should realize that the pulse width modulation signal (PWM) is also allowed to serve as the pulse modulation signal PM in the embodiment of the invention. The difference between PDM and PWM is that the width of output pulses within a time unit would vary according to the digital values inside the microprocessor M201. In other words, the pulse width within a time unit is wider with the increase of the digital values. However, using pulse width modulation signal to serve as the pulse modulation signal would result in the larger time constant in the low-pass filter design. It means larger capacitance should be used, or else the larger ripple voltage would be generated. On the other hand, using pulse density modulation signal would result in the smaller time constant in the low-pass filter design since the pulses distribution within a specific time is more uniform.

Figure 5:
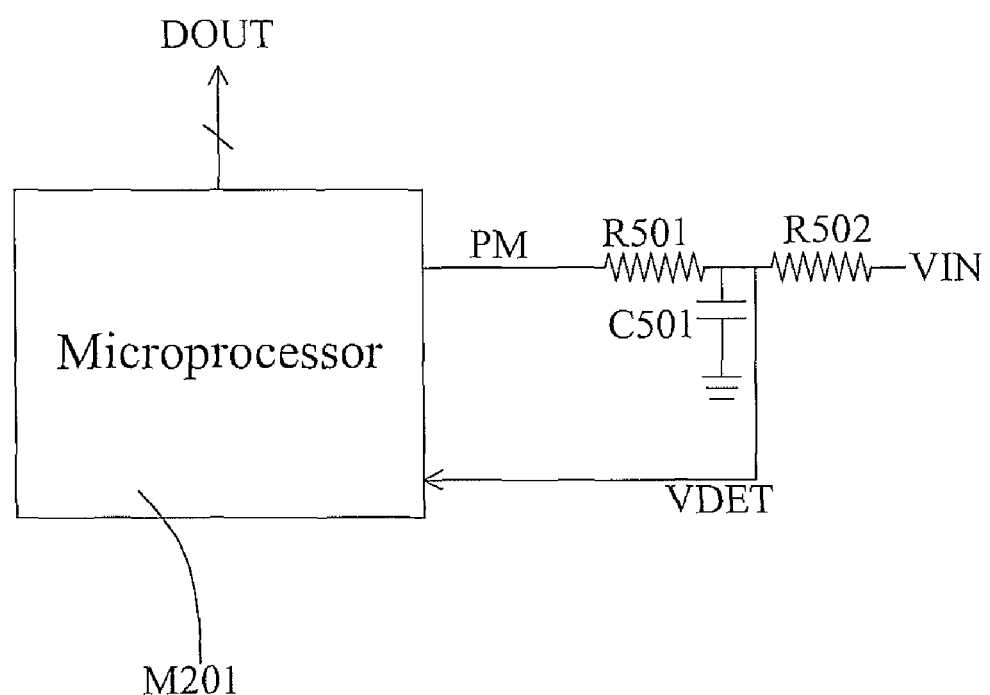
FIG. 5 is another detailed circuit diagram of a low cost analog to digital converter according to the embodiment of the invention shown in FIG. 2.

FIG. 5 is another detailed circuit diagram of a low cost analog to digital converter according to the embodiment of the invention shown in FIG. 2. The analog adder A201 is implemented by resistors R501 and R502; the low-pass filter L201 is implemented by a capacitor C501 and the resistor R501. Generally speaking, the resistance of resistors R501 and R502 would be designed to a large value to reduce the load effect, and therefore the capacitance of C501 could be minimized. The theorem of the implementation is the same as those of the embodiment of FIG. 3, thus detailed description is omitted. In reality the capacitance of C501 is hoped to be designed as small as possible, the better implementation of the pulse modulation PM will result in pulse density modulation (PDM) rather than pulse width modulation (PWM) here for minimizing the capacitance C501.

Figure 6:
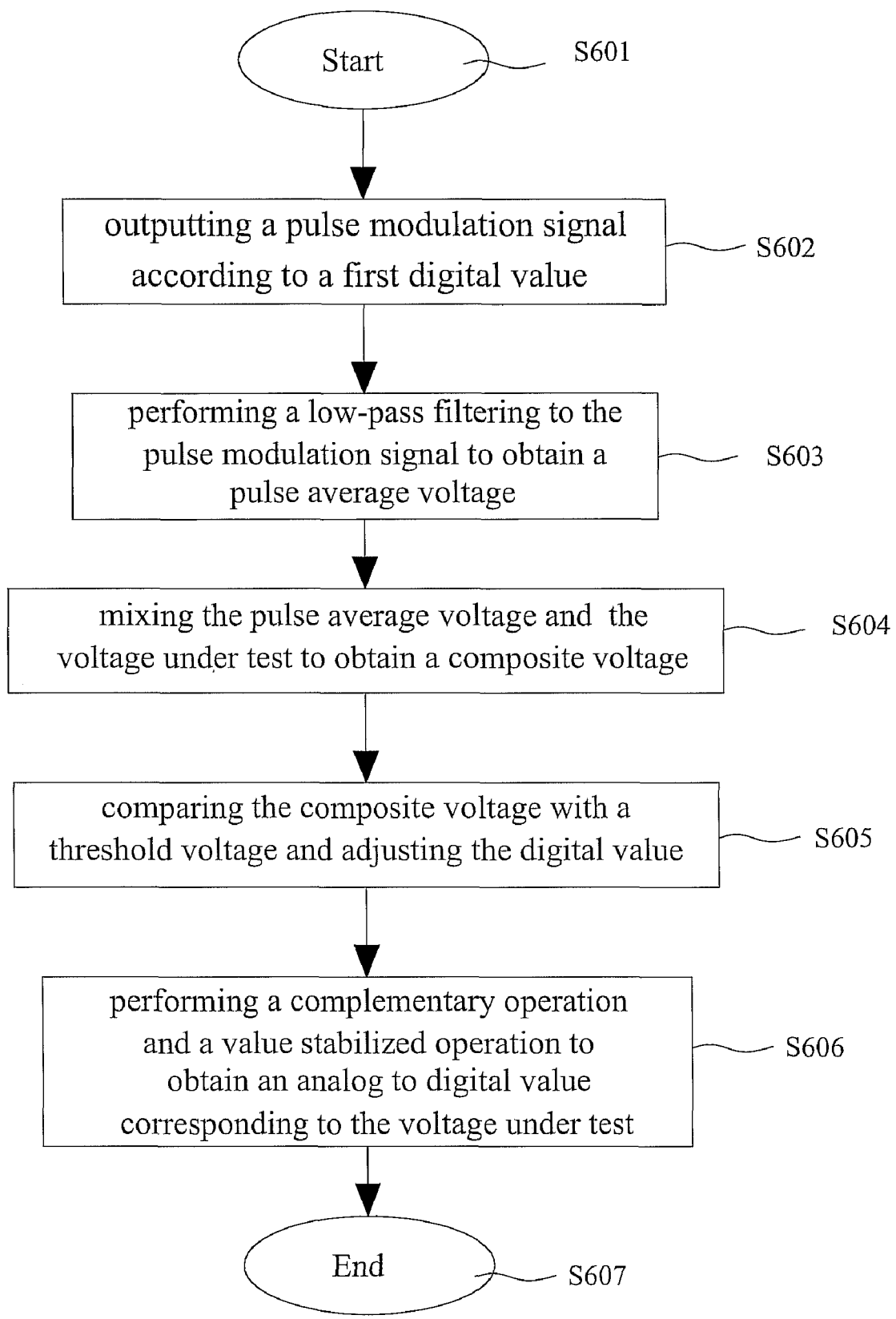
FIG. 6 is a flow chart showing a method of analog to digital conversion according to the embodiment of the invention.

From the embodiment above, the invention can be generalized a method for analog to digital conversion and a flow chart is drawn in FIG. 6. Referring to FIG. 6, the method for analog to digital includes the following steps.

In step S601, the procedure starts.

In step S602, a pulse modulation signal is outputted according to a digital value. The microprocessor M201 outputs a pulse density modulation signal (PDM) or pulse width modulation signal (PWM) according to the digital value inside the microprocessor M201 in the said embodiment.

In step S603, the pulse modulation signal is filtered by a low-pass filter and a pulse average voltage is obtained from the low-pass filter. Referring to the above-mentioned embodiment, a pulse average voltage VDAC corresponding to the digital value inside the microprocessor M201 is obtained by using a low-pass filter L201 to filter the outputted pulse modulation signal PM.

In step S604, a composite voltage is obtained by mixing the pulse average voltage VDAC with a first proportion and a voltage under test VIN with a second proportion. Referring to the embodiment, the resistors R202 and R203 are used to combine the pulse average voltage VDAC with the voltage under test VIN to obtain a composite voltage VDET.

In step S605, the composite voltage is compared with a threshold voltage, and the digital value is adjusted such that the composite voltage VDET approaches the threshold voltage (VTH). By adjusting the first digital value inside the microprocessor M201 to make the composite voltage VDET be close to the logic threshold voltage of the input pin of the microprocessor M201.

In step S606, the digital value is used to perform a complementary operation and a value stabilized operation to obtain an analog to digital value corresponding to the voltage under test VIN. Referring to the proof of EQ1~EQ5. Moreover, the said composite voltage VDET vibrates near the threshold voltage (VTH), which means the digital value change with time. Therefore, the value stabilized operation is used to settle this situation.

In step S607, the procedure ends.

Figure 7:
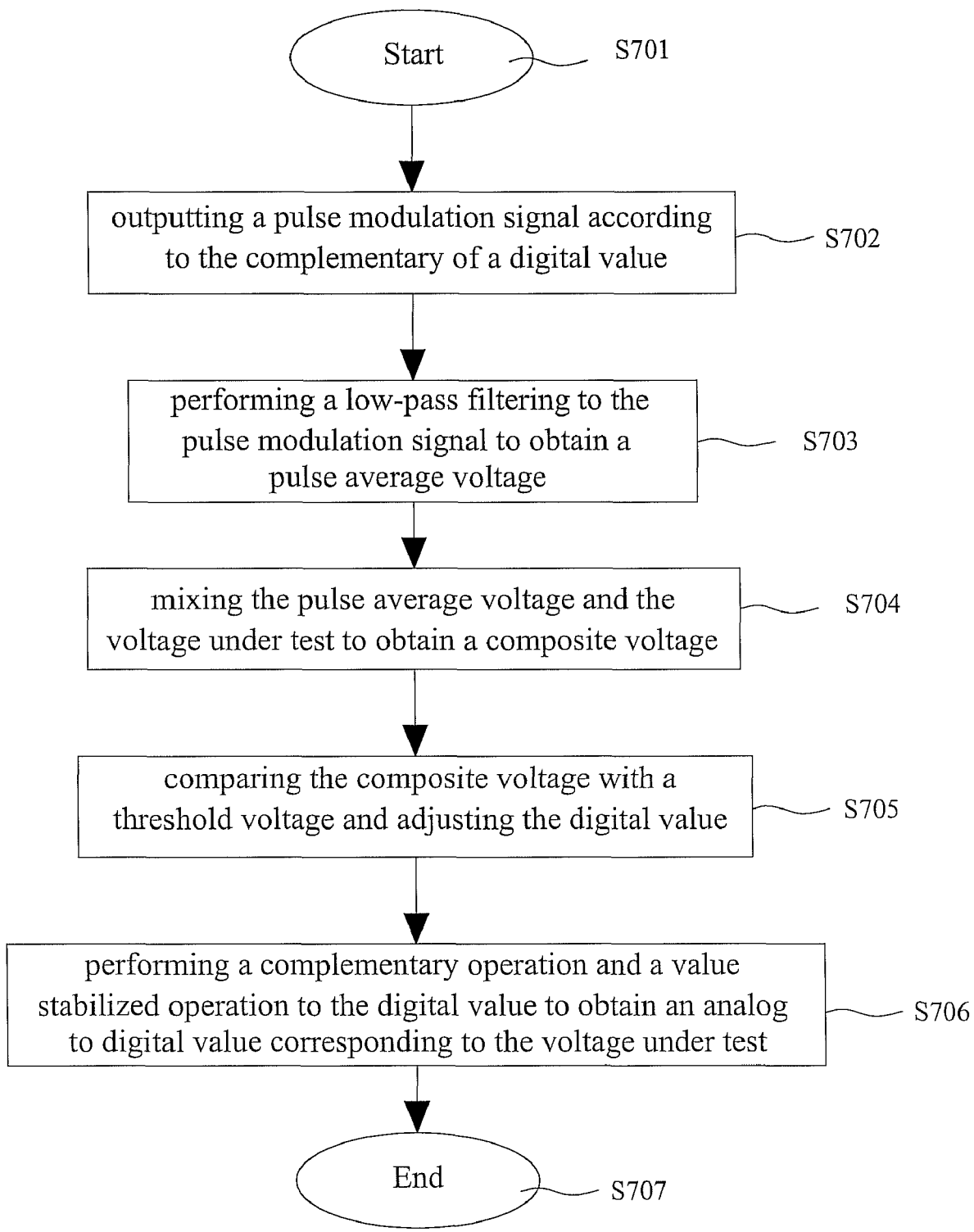
FIG. 7 is a flow chart showing a method of analog to digital conversion according to the embodiment of the invention.

FIG. 7 is a flow chart illustrating a method for analog to digital conversion according to the embodiment of the invention. Referring to FIG. 6 and FIG. 7, the embodiment of the said FIG. 6 could be modified to a different type as shown in FIG. 7. Moreover, the method for analog to digital conversion includes the following steps.

In step S701, the procedure starts.

In step S702, a pulse modulation signal is outputted according to the complementary of a digital value.

In step S703, the pulse modulation signal is filtered by a low-pass filter and a pulse average voltage is obtained from the low-pass filter.

In step S704, a composite voltage is obtained by putting the pulse average voltage VDAC with a first proportion and a voltage under test VIN with a second proportion together.

In step S705, the composite voltage is compared with a threshold voltage (VTH), and the digital value is adjusted such that the composite voltage VDET approaches the threshold voltage (VTH).

In step S706, the digital value is used to perform a complementary operation and a value stabilized operation to obtain an analog to digital value corresponding to the voltage under test VIN.

In step S707, the procedure ends.

Comparing the embodiments of FIG. 6 and FIG. 7, it is clear to find out the output pulse modulation signal in FIG. 7 corresponding to the complementary of the digital value. Therefore, it is unnecessary to perform a complementary operation at last and the digital value can be used to represent the voltage under test VIN.

Similarly, the digital value can be used to perform a complementary operation in advance for the circuits of FIG. 2, FIG. 3, and FIG. 5. The features of the modification have been proved in the above and thus the detailed description is omitted. The main advantage of the method is that the output digital value of the microprocessor can directly represent the analog to digital converted value and there is unnecessary to perform the following complementary operation. To perform the complementary operation can be implemented by look-up table or the software program code. Generally speaking, the preferred implementation thereof is to use the look-up table. To use the look-up table can not only increase the speed of the analog to digital converter and the method for converting the analog signal to digital signal in the embodiments the invention, but also can increase the accuracy of the analog to digital converted value.

In summary, the spirit of the invention is to modify the internal digital value in a microprocessor for changing the output pulse modulation signal, to convert a analog signal to the digital signal through using a low-pass filter, and to mix the analog signal corresponding to the digital signal and the analog voltage under test being converted to a digital signal by using an analog adder for obtaining a composite voltage, and then to adjust the internal digital value of the microprocessor based on the threshold voltage which is built in the input terminal of the microprocessor, such that the composite voltage approaches the threshold voltage. Since the obtained digital value could respond to the analog voltage under test at the time. The digital value corresponding to the analog voltage under test can be therefore obtained by performing a complementary operation to the inner digital value.

The above-mentioned devices, such as the analog adder, the low-pass filter, and so forth, can easily be implemented by cheap passive components, so the invention can perform the analog to digital conversion with lower cost.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A low cost analog to digital converter, comprising:
   a microprocessor, comprising a first output terminal, a second output terminal and an input terminal, wherein the first output terminal thereof is used for providing a pulse modulation signal according to a first digital value, and the input terminal comprises a logic threshold voltage;
   a low-pass filter, coupled to the first output terminal of the microprocessor, for performing the filtering operation to the pulse modulation signal to output a pulse average voltage; and
   an analog adder, comprising a first input terminal for receiving the pulse average voltage, a second input terminal for receiving a voltage under test, and an output terminal for providing a composite voltage, wherein the composite voltage comprises the pulse average voltage with a first proportion and the voltage under test with a second proportion,
   wherein the input terminal of the microprocessor receives the composite voltage, and adjusts the first digital value such that the composite voltage approaches the logic threshold voltage, and then an analog to digital conversion value corresponding to the voltage under test is obtained according to the first digital value, wherein the second output terminal of the microprocessor is used for outputting the analog to digital conversion value,
   wherein
   a complementary operation is provided to the first digital value to obtain a analog to digital conversion value corresponding to the voltage under test.

2. The low cost analog to digital converter according to claim 1, wherein the low-pass filter comprises:
   a first resistor, comprising a first terminal and a second terminal, wherein the first terminal thereof is coupled to the first output terminal of the microprocessor; and
   a first capacitor, comprising a first terminal coupled to the second terminal of the first resistance and a second terminal coupled to a common voltage.

3. The low cost analog to digital converter according to claim 2, wherein the analog adder comprises:
   a second resistor, comprising a first terminal and a second terminal, wherein the first terminal thereof is coupled to the second terminal of the first resistor; and
   a third resistor, comprising a first terminal coupled to the second terminal of the second resistor and a second terminal for receiving the voltage under test.

4. The low cost analog to digital converter according to claim 1, wherein the analog adder comprises:
   a first resistor, comprising a first terminal coupled to the first output terminal of the microprocessor and a second terminal coupled to the input terminal of the microprocessor; and
   a second resistor, comprising a first terminal coupled to the second terminal of the first resistor and a second terminal for receiving the voltage under test.

5. The low cost analog to digital converter according to claim 4, wherein the low-pass filter comprises:
   a first capacitor, comprising a first terminal coupled to the second terminal of the first resistor and a second terminal coupled to a common voltage.

6. The low cost analog to digital converter according to claim 1, wherein the pulse modulation signal is a pulse width modulation signal.

7. The low cost analog to digital converter according to claim 1, wherein the pulse modulation signal is a pulse density modulation signal.

8. A method for analog to digital conversion, comprising the steps of:
   outputting a pulse modulation signal according to a first digital value;
   performing a low-pass filtering to the pulse modulation signal to obtain a pulse average voltage;

mixing a first proportion of the pulse average voltage and a second proportion of the voltage under test to obtain a composite voltage;

comparing the composite voltage with a threshold voltage and adjusting the first digital value such that the composite voltage approaches the threshold voltage; and performing a complementary operation and a value stabilized operation to obtain an analog to digital value corresponding to the voltage under test.

9. The method for analog to digital conversion according to claim 8, wherein "obtaining the composite voltage through mixing the first proportion of the pulse average voltage and the second proportion of the voltage under test" comprises the steps of providing a first resistor and a second resistor, wherein the second terminal of the first resistor is coupled to the first terminal of the second resistor;

providing the pulse average voltage to the first terminal of the first resistor;

providing the voltage under test to the second terminal of the second resistor; and obtaining the composite voltage from the second terminal of the first resistor.

10. The method for analog to digital conversion according to claim 8, wherein the pulse modulation signal is a pulse width modulation signal.

11. The method for analog to digital conversion according to claim 8, wherein the pulse modulation signal is a pulse density modulation signal.

12. The method for analog to digital conversion according to claim 8, wherein "performing the complementary operation and the value stabilized operation to obtain the analog to digital value corresponding to the voltage under test" further comprises:

performing the value stabilized operation to obtain a stable digital value; and performing the complementary operation to the stable digital value to obtain the analog to digital value corresponding to the voltage under test.

13. A method for analog to digital conversion, comprising the steps of:

performing a complementary operation to a first digital value to obtain a second digital value;

outputting a pulse modulation signal according to the second digital value;

performing a low-pass filtering to the pulse modulation signal to obtain a pulse average voltage;

mixing the pulse average voltage with a first proportion and the voltage under test with a second proportion to obtain a composite voltage;

comparing the composite voltage with a threshold voltage and adjusting the first digital value such that the composite voltage approaches the threshold voltage; and setting the second digital value to serve as an analog to digital value corresponding to the voltage under test.

14. The method for analog to digital conversion according to claim 13, further comprising:

performing a value stabilized operation to the first digital value.

15. The method for analog to digital conversion according to claim 13, wherein setting the second digital value to serve as an analog to digital value corresponding to the voltage under test comprises:

performing a value stabilized operation to the second digital value to obtain a stable digital value; and setting the second digital value to serve as an analog to digital value corresponding to the voltage under test.

16. A low cost analog to digital converter, comprising:

a microprocessor, comprising a first output terminal, a second output terminal and an input terminal, wherein the first output terminal thereof is used for providing a pulse modulation signal according to a first digital value, and the input terminal comprises a logic threshold voltage;

a low-pass filter, coupled to the first output terminal of the microprocessor, for performing the filtering operation to the pulse modulation signal to output a pulse average voltage; and an analog adder, comprising a first input terminal for receiving the pulse average voltage, a second input terminal for receiving a voltage under test, and an output terminal for providing a composite voltage, wherein the composite voltage comprises the pulse average voltage with a first proportion and the voltage under test with a second proportion, wherein the input terminal of the microprocessor receives the composite voltage, and adjusts the first digital value such that the composite voltage approaches the logic threshold voltage, and then an analog to digital conversion value corresponding to the voltage under test is obtained according to the first digital value, wherein the second output terminal of the microprocessor is used for outputting the analog to digital conversion value, wherein a complementary operation is performed to the first digital value to obtain a second digital value; and the pulse modulation signal is performed according to the second digital value.

17. The low cost analog to digital converter according to claim 16, wherein the analog adder comprises:

a second resistor, comprising a first terminal and a second terminal, wherein the first terminal thereof is coupled to the second terminal of the first resistor; and a third resistor, comprising a first terminal coupled to the second terminal of the second resistor and a second terminal for receiving the voltage under test.

18. The low cost analog to digital converter according to claim 16, wherein the analog adder comprises:

a first resistor, comprising a first terminal coupled to the first output terminal of the microprocessor and a second terminal coupled to the input terminal of the microprocessor; and a second resistor, comprising a first terminal coupled to the second terminal of the first resistor and a second terminal for receiving the voltage under test.

* * * * *